United States Patent
Murgia et al.

(10) Patent No.: US 6,369,722 B1
(45) Date of Patent: Apr. 9, 2002

(54) CODING, DECODING AND TRANSCODING METHODS

(75) Inventors: Carlo Murgia, Irvine, CA (US); Gaël Richard, Velizy; Philipe Lockwood, Vaureal, both of (FR)

(73) Assignee: Matra Nortel Communications, Quimper (FR)

(*) Notice: Subject to any disclaimer, the term of this patent is extended or adjusted under 35 U.S.C. 154(b) by 0 days.

(21) Appl. No.: 09/527,633

(22) Filed: Mar. 17, 2000

(51) Int. Cl.$^7$ ............................................. H03M 7/00
(52) U.S. Cl. ..................................... 341/50; 341/67
(58) Field of Search ........................... 341/50, 51, 59, 341/61, 67

(56) References Cited

U.S. PATENT DOCUMENTS

| | | | |
|---|---|---|---|
| 4,899,384 A | 2/1990 | Crouse et al. ............ 704/200.1 |
| 5,272,698 A | * 12/1993 | Champion ................... 341/61 |
| 5,388,181 A | 2/1995 | Anderson et al. ........... 704/229 |
| 5,600,320 A | * 2/1997 | Wilson et al. ................ 341/61 |
| 5,864,650 A | 1/1999 | Taniguchi et al. .......... 704/220 |
| 6,242,347 B1 | * 6/2001 | Bukhmutsky ................ 341/50 |

FOREIGN PATENT DOCUMENTS

FR   2 766 032   1/1999

* cited by examiner

Primary Examiner—Trong Phan
(74) Attorney, Agent, or Firm—Trop, Pruner & Hu, P.C.

(57) ABSTRACT

On the basis of a portion of the signal, a coder selects a parameter vector belonging to a reference library containing $2^Q$ vectors each designated by an address of Q bits. This coder, or a transcoder located downstream, forms a digital data stream ($\Phi$) containing an index deduced from the address of the vector selected. For each rate value corresponding to an integer $p \geq 0$, the index contained in the digital data stream is formed of Q–p bits which, completed by p bits of predetermined positions, define indices of Q bits representing a group of $2^p$ addresses including that of the vector selected from the reference library. The decoder receiving the digital data stream, or a transcoder located upstream, is capable of reconstructing appropriate parameter vectors on the basis of the truncated index. Thus very fine steps are obtained in the adjustment of the transmission rate.

53 Claims, 7 Drawing Sheets

CODING, DECODING AND TRANSCODING METHODS

BACKGROUND OF THE INVENTION

This invention relates to the coding of digital signals and more especially coding, decoding and where applicable transcoding methods using vector quantification.

Vector quantification is commonly used in various coding methods. In what follows in this description, attention will be given more particularly to the coding of audio signals, though this is non-limiting.

The invention considers the problem of scalability of the digital data stream transmitted between a coder and a decoder. This property consists in the ability of the coder to construct variable rate output data streams on the basis of the same coding scheme applied to the coded digital signal, and in the corresponding ability of the decoder to reconstruct a faithful version of the signal.

The difficulty here is to secure the highest possible coding quality for each data rate value without unduly increasing the complexity of the circuits used.

Data stream scalability is of particular importance where the data stream is likely to be carried on packet switching networks, such as networks operating according to the IP (Internet Protocol). Historically, the majority of coders have been developed for broadcasting or communications applications in circuit mode, leading to fixed rate coders or coders with the rate selected from several possible values when the connection is set up. In the packet mode context, it is better that the rate should vary more dynamically, so that the data stream can be matched to the congestion encountered when the packets are conveyed while ensuring that the communication is maintained.

Patent application WO99/03210 describes a scalable data stream audio coder having several coding stages. The first stage comprises a coding core, which may be a standard coder of the CELP (Code-Excited Linear Prediction) or other type, and possibly a bank of sub-band separation filters and additional modules to quantify sub-bands higher than the one processed by the coding core. The second stage comprises another bank of filters to separate into sub-bands the residual error signal at the output of the coding core, modules to quantify the components coming from this separation into sub-bands and where applicable additional modules to quantify the residual error signals at the output of the modules quantifying the higher sub-bands of the first stage. The residual error signals at the output of the second stage can then be processed by a third stage etc. The output digital data stream from this coder can be scaled by adjusting the number of coding/quantification modules contributing to it. For the lowest rate, only the coding core is involved. To increase the rate, components and/or stages quantifying the residual errors are added, U.S. Pat. No. 5,864,650 discloses a method for generating a library of the tree-structured type containing $2^L$ vectors obtained by algebraic sums of L basic vectors. As regards the coder, the search for the vector coding a specific value of a signal to be transmitted proceeds by successive selections from the root to the leaves of the code tree, stopping at the code tree stage corresponding to the number of quantification bits available. A library of this kind is however very constrained and does not allow good coding quality.

U.S. Pat. No. 4,899,384 discloses a bit allocation method in connection with coding in sub-bands, this allocation taking account of the level and energy distribution in the band and in each sub-band, so as to comply with a global data rate constraint while keeping degradation of the signal transmitted to a minimum. However, the quantification envisaged in this document is scalar quantification and not vector quantification.

One main purpose of this invention is to obtain fine adjustment of the rate in the scalability of the digital data stream, allowing the best rate/quality compromise to be sought as a function of the communication conditions.

SUMMARY OF THE INVENTION

A first aspect of the invention refers to a method for coding a signal in which, on the basis of a portion of the signal, at least one coding parameter vector is selected belonging to a reference library containing $2^Q$ vectors each designated by an address of Q bits, and an output digital data stream is formed containing an index deduced from the address of the vector selected from the reference library. According to this method, the output digital data stream has a rate which is adjustable by varying the number Q−p of bits forming this index contained in the digital data stream. For each rate value corresponding to a value of the integer p≧0, the index contained in the digital data stream is formed of Q−p bits which, completed by p arbitrary bits of predetermined positions, define the indices of Q bits representing a group of $2^p$ addresses including the address of the vector selected from the reference library.

A reduction in the coder rate results from the deletion of p bits of certain vector quantification indices. By varying this number p, we are able to achieve very fine scalability of the output digital data stream.

In order to minimise the impact of the reduction in rate on the quality of the signal which the decoder is capable of reconstructing, the p bits deleted will generally be the least significant bits of the index concerned.

Provision can then be made, for least one rate value corresponding to a value of the integer p>0, for the reference library to be ordered so as to verify a criterion of minimum distances between the vectors belonging to each group of $2^p$ vectors of the reference library having respective addresses which differ only in the p bits having the predetermined positions mentioned.

Another possibility is to look up a transcoding table on the basis of the address of the vector selected from the reference library to obtain a first index of Q bits. For each rate value corresponding to a value of the integer p≧0, the index contained in the output digital data stream is then formed of Q−p bits extracted from this first index of Q bits excluding p bits of predetermined positions.

This last possibility is of interest in that it enables an existing coder, optimised according to other criteria, to be matched to the concept of scalability, the transcoding table enabling the degradation in quality due to the removal of certain bits to be limited. Under these conditions, the coder may have a first mode of operation in which, for each rate value corresponding to a value of the integer p≧0, the index contained in the output digital data stream is formed of Q−p bits extracted from this first index of Q bits and a second mode of operation with defined rate in which the address of the vector selected from the reference library is included in the output digital data stream instead of this index formed of Q−p bits. One or other of the two modes will be chosen depending on the capabilities of the decoder receiving the data stream and/or according to the means used to convey the data stream as far as this decoder.

A second aspect of the invention relates to a method for decoding a digital data stream representative of a coded signal, the digital data stream containing, for a portion of the signal, at least one index enabling a coding parameter vector, used to construct a decoded version of this portion of the signal, to be obtained by means of a reference library containing $2^Q$ vectors each designated by an address of Q bits. In this decoding method, the digital data stream rate depends on the number Q−p of bits forming this index. For each rate value corresponding to a value of the integer $p \geq 0$, we obtain the coding parameter vector on the basis of at least one vector in the reference library having an address which belongs to a group of $2^P$ addresses represented respectively by the indices of Q bits formed by completing by p arbitrary bits of predetermined positions the index of Q−p bits contained in the digital data stream.

Several methods may be applied to obtain the coding parameter vector on the basis of the index of Q−p bits when $p \geq 0$.

The decoding method may thus comprise a mode of operation by vector selection in which, for at least one rate value corresponding to a value of the integer $p \geq 0$, we obtain the coding parameter vector by selecting from the reference library a vector having an address which belongs to the group of $2^P$ addresses mentioned.

In this mode, the p bits completing the Q−p bits of the index contained in the digital data stream to represent the address of the vector selected may be bits of predetermined values. This is appropriate if the coder has performed the vector quantification using a sub-library of cardinal $2^{Q-P}$ constituted by the vectors of the reference library having addresses which are represented by indices having these predetermined values for the p missing bits.

These p bits may also be drawn at random. This is appropriate if the magnitudes quantified vectorially by the $2^P$ vectors with addresses which belong to the group have a relatively uniform statistical distribution.

In another version of the mode of operation by vector selection, the coding parameter vector is obtained by selecting it from among the vectors in the reference library having respective addresses belonging to this group of $2^P$ addresses on the basis of information on the coded signal, which can be read from the digital data stream or again obtained by analysis of the decoded version of the signal.

As a variant, or supplement, the decoding method may comprise a mode of operation by averaging vectors in which, for at least one rate value corresponding to a value of the integer $p \geq 0$, the coding parameter vector is obtained by taking an average of several vectors in the reference library having respective addresses which belong to this group of $2^P$ addresses.

The average taken to obtain the coding parameter vector may be a uniform average of the vectors in the reference library having respective addresses which belong to the group of $2^P$ addresses mentioned. This is appropriate if the magnitudes quantified vectorially by the $2^P$ vectors have a relatively uniform statistical distribution.

It may also be an average weighted to take account of a non-uniform distribution. The weightings used may be fixed coefficients assigned to the reference library vectors in a manner representative of the theoretical probabilities of their occurrence. They may also be variable coefficients determined on the basis of information on the coded signal. This information, referring for example to the degree to which the signal is steady-state, can be read from the digital data stream or again obtained by an analysis of the decoded version of the signal.

In one form of execution of the decoding method, a transcoding table is looked up on the basis of at least one of the indices of Q bits mentioned formed by completing the index of Q−p bits contained in the digital data stream to obtain at least one of the $2^P$ addresses of this group. Similarly to the case of the coding method mentioned above, the decoding method nay then comprise a first mode of operation in which, for each rate value corresponding to a value of the integer $p \geq 0$, the coding parameter vector is obtained on the basis of at least one vector in the reference library, the address of which is obtained by looking up a transcoding table, and a second mode of operation with a defined rate in which the index contained in the digital data stream is of Q bits and the coding parameter vector is obtained as being the vector with an address equal to this index of Q bits from the reference library.

A third aspect of the invention relates to a method for transcoding an input digital data stream representative of a signal coded by means of at least one reference library containing $2^Q$ coding parameter vectors each designated by an address of Q bits, to form a lower rate output digital data stream, in which the input digital data stream contains, for a portion of the signal, at least one index of Q bits which is equal to the address in the reference library of a selected coding parameter vector, in which a transcoding table is looked up on the basis of the address of the vector selected to obtain another index of Q bits, and in which, in the output data stream, the index of Q bits contained in the input data stream is replaced by translated index of Q−p bits which, completed by p arbitrary bits of predetermined positions, define indices of Q bits representing a group of $2^P$ addresses including the address, already mentioned, of the vector selected, p being an integer such that 0<p<Q, this translated index of Q−p bits being formed of Q−p bits extracted from the other index of Q bits mentioned, excluding p bits of predetermined positions.

This transcoding method can be employed in various contexts. For example, the input digital data stream may be read from the memory of an audio server. It can also be received on a link in a telecommunications network, the output digital data stream being re-transmitted on another link in the network or on a link of another network.

A fourth aspect of the invention relates to a method for transcoding an input digital data stream representative of a signal coded by means of at least one reference library containing $2^Q$ vectors each designated by an address of Q bits to form a higher rate binary output data stream, in which the input digital data stream contains, for a portion of the signal, at least one index of Q−p bits which, completed by p arbitrary bits of predetermined positions, define indices of Q bits representing a group of $2^P$ addresses of vectors in the reference library, p being an integer such that 0<p<Q, and in which, on the basis of this index of Q−p bits, a translated index of Q bits representing one of the addresses of this group of $2^P$ vector addresses is determined, and this translated index of Q bits is inserted into the output data stream.

This is a transcoding method which is the reverse of the previous method. The vector having an address which is represented by the translated index of Q bits may be selected by one of the methods mentioned above for the selection of a vector in the decoding method.

BRIEF DESCRIPTION OF THE DRAWINGS

Other particular features and advantages of this invention will appear in the description below of non-limiting examples of embodiment, with reference to the attached drawings, in which.

DESCRIPTION OF THE PREFERRED EMBODIMENT

The invention is described below in its application, non-limiting, to the coding of audio signals. As an example, a coder of the type described in patent application WO99/03210 is considered, and this illustrates several ways of employing the invention. In fact, this coder operates vector quantifications at several levels, each of which are suitable for the process of obtaining scalability of the digital data stream. It will be appreciated that the invention is applicable to many other types of audio coding, and more generally to any signal coding using vector quantification.

Figure 1:
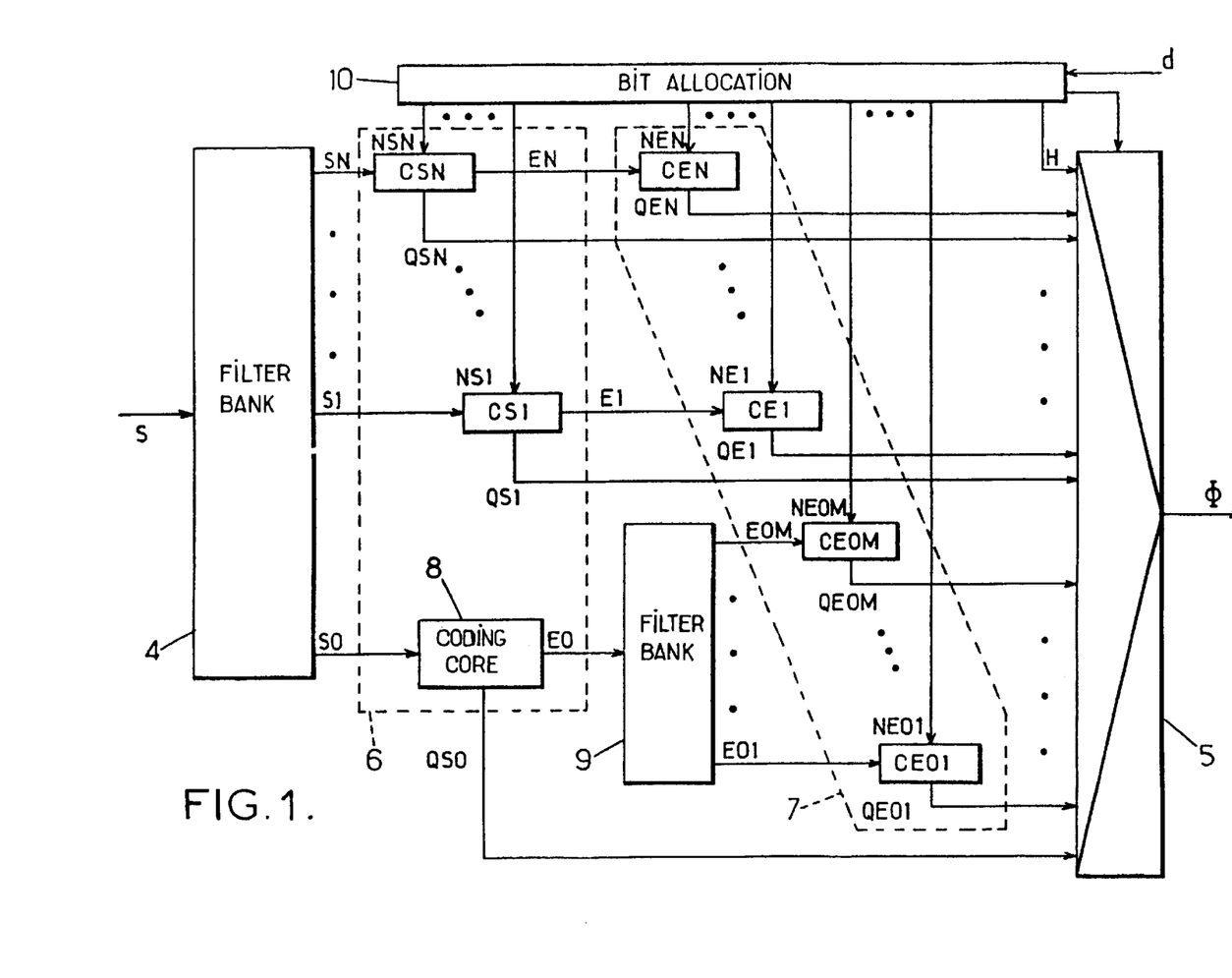
FIG. 1 is the block diagram of an example of an audio coder which can utilize the invention.

The coder shown in FIG. 1 operates on the spectral components of the digital audio signal S to be coded which, in the case considered, are obtained by separating the signal S into sub-bands by means of a bank of filters 4 (in other embodiments, these fight be spectral components obtained by Fourier transform or similar).

The input signal S is thus separated into a base signal S0 and a number N of high band signals S1–SN. The separation into sub-bands may be linear, each sub-band then having the same spectral width, or non-linear. In the latter case, the sub-bands may correspond to the scale of BarCs (see E. Zwicker et al. "Psychoacoustics, the ear as information receiver", Editions Masson, Paris, 1981). If the pass band of the input signal does not exceed 8 kHz, the use of a Barks scale in the bank of filters 4 does not appreciably improve the effectiveness of the coding, so that the greater complexity required by separation into sub-bands according to this scale may be dispensed with.

In order that the process of separation into sub-bands should not degrade the input signal, a bank of perfect reconstruction filters is used, consisting for example of QMF filters, or preferably filters separating into wavelets of 36 coefficients.

In the remainder of this description, it will be considered, though this is non-limiting, that the base signal S0 corresponds to a base band of 0 to 4 kHz and that the high band signals S1, S2, etc. correspond to the bands 4–5 kHz, 5–6 kHz, 6–7 kHz, 7–8 kHz, 8–10 kHz, 10–12 kHz, 12–14 kHz, 14–16 kHz, 16–20 kHz, 20–24 kHz and 24–32 kHz. This kind of increase in bandwidth may be seen as an approximation to the Barks scale which can be achieved with a bank of filters of reduced complexity. The list of the high bands given above corresponds to the case in which N=11 and is appropriate for an input signal with a pass band of up to 32 kHz (sampling frequency 64 kHz). For smaller pass bands, the number N is smaller, and only the first N bands of the list above are used.

Each of the high band signals S1–SN is submitted to a respective coding module CS1–CSN. Each coding module CSn ($1 \leq n \leq N$) operates vector quantification of the signal Sn which is submitted to it. This signal is broken up into successive segments formed of digital samples at a sampling rate lower than that of the input signal S. For each segment, the coder CSn selects a waveform from a predetermined library and a gain such that the estimated signal S'n constituted by this waveform multiplied by this gain shows a minimum difference from the signal Sn. This difference constitutes a quantification error signal, shown as En on the drawing ($1 \leq n \leq N$). Vector quantification methods are well known in the field of audio signal processing (see N. Moreau, "Signal compression techniques", Editions Masson, CNET collection, Paris 1995). Over each time window constituted by one or more successive segments, the waveforms and gains selected are quantified over a number NSn of bits. These NSn bits form coding parameters QSn of the signal Sn which are supplied to the multiplexer 5 forming the output digital data stream Φ of the coder.

The coding modules CSn are part of a first coding stage 6. The coder in FIG. 1 comprises a second coding stage 7 including N modules CE1–CEN for vector quantification of the error signals E1–EN respectively delivered by the modules CS1–CSn in the first stage. Each module CEn ($1 \leq n \leq N$) performs vector quantification of the error signal En to produce coding parameters QEn, represented by NEn bits over each window, and which are supplied to the output multiplexer 5.

For the coding of the base signal S0, the first stage 6 comprises a coding core 8 consisting of a standard coder. Examples of standard coders are the G0.723 coder (see "Dual rate speech codec for multimedia communication transmitting at 5.3 and 6.3 kbits/s", Recommendation ITU-T G.0.723.1, March 1996), and the TETRA coder (see "Radio equipment and systems (RES), Trans-European Trunked Radio (TETRA), Speech codec for full-rate traffic channel, part 2: TETRA codec", ETSI Recommendation, Del ETS 300 395–2, Dec. 6, 1996). These examples of coders are synthetic analysis speech coders, that is to say that they proceed by minimising an error signal E0 equal to the difference between the signal S0 supplied to the coding core and a synthetic signal S'0 constructed on the basis of the coding parameters. QS0 selected. These parameters QS0 are supplied to the output multiplexer 5.

The error signal E0 is also available at the output of the coding core 8. This error signal is then submitted to another bank of filters 9 for separation into sub-bands.

The filter bank 9 is of the same type as the filter bank 4. It operates a linear separation of the signal E0 into M sub-bands. The number M is equal, say, to 8 which, in the example considered previously in which the base signal S0 is in the band 0–4 kHz, gives sub-bands with a width of 0.5 kHz (1 kHz sampling) at the output of the filter bank 9.

The M spectral components of the error signal E0 supplied by the bank of filters 9 are designated F01 to E0M. Each of these components E0m ($1 \leq m \leq M$) is submitted to a respective coding module CE0m belonging to the second stage 7 of the coder, These modules CE0m operate by vector quantification in the same way as the modules CEn described previously. The coding parameters delivered by the module CE0m have the notation QE0m and represent a number NE0m of bits per window which are supplied to the output multiplexer 5.

The numbers of bits NSn, NEn and NE0m are supplied to the different vector quantification modules by a bit allocation unit 10. This unit 10 also constructs a header H for the output data stream Φ of the coder. This header H describes the distribution of the bits in the digital data stream. The unit 10 also controls the multiplexer 5 to construct the data stream Φ.

Figure 2:
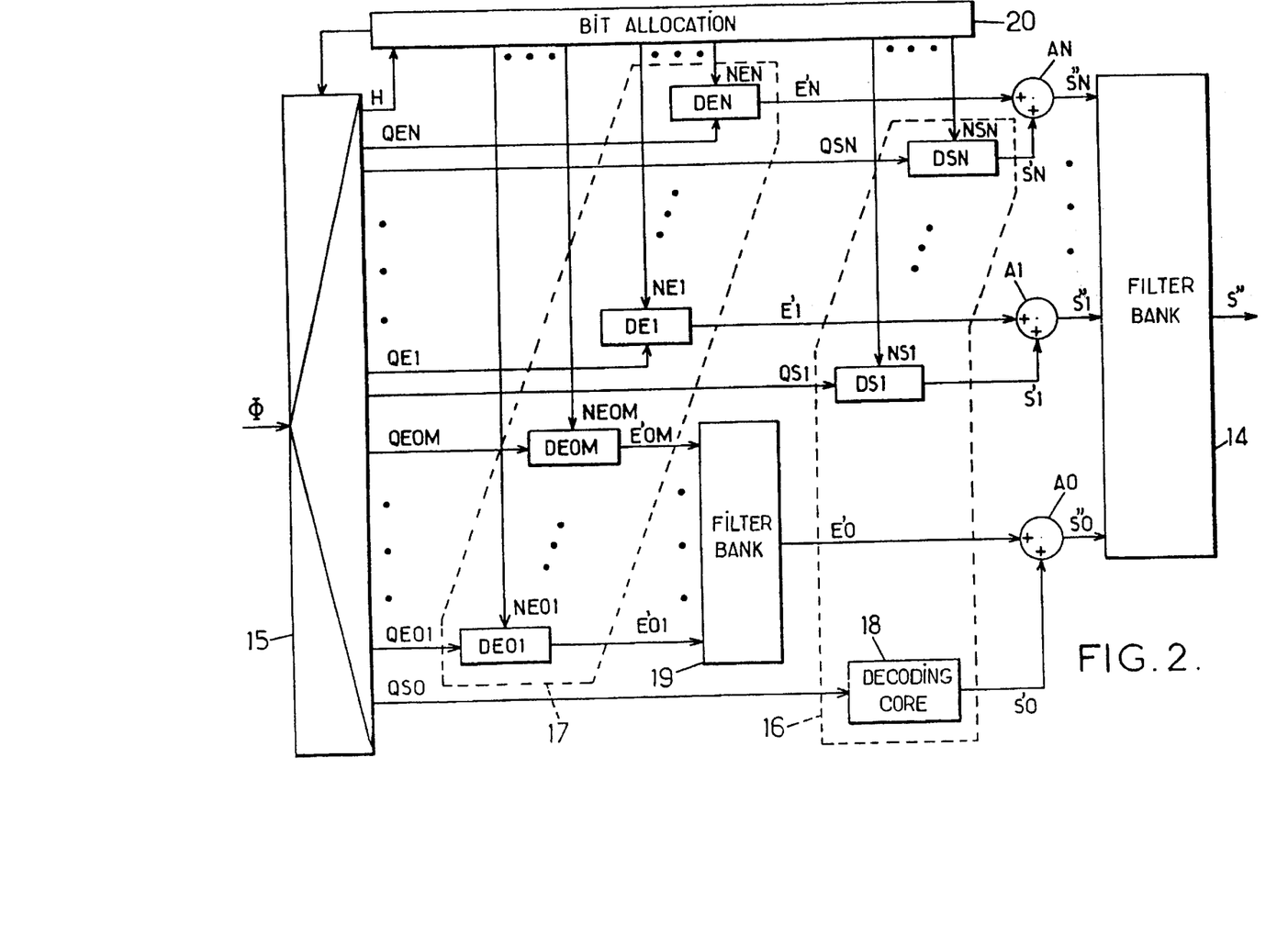
FIG. 2 is the block diagram of an associated decoder.

The dual decoder shown in FIG. 2 comprises a demultiplexer 15 receiving the data stream Φ from the coder. The demultiplexer 15 extracts the header H and the address to a bit allocation unit 20. The unit 20 then analyses the structure of the data stream and controls the demultiplexer 15 accordingly so that it delivers the relevant parameters for the different modules of the decoder.

The decoder comprises a set of modules 17 performing the reverse of the operations of the coding modules in the second stage 7 of the coder. The set 17 thus comprises N decoding modules DE1–DEN which reconstruct the estimates E'1–E'N of the error signals E1–EN, on the basis of the coding parameters QE1–QEN extracted by the demultiplexer 15. The set 17 also comprises M decoding modules DE01–DE0M which reconstruct the estimates E'01–E'0M of the components in subbands E01–E0M of the error signal E0 on the basis of the coding parameters QE01–QE0M extracted by that the multiplexer 15.

A bank of recombining filters 19, corresponding to the bank of separation filters 9 of the coder, forms the estimate E'0 of the error signal E0 on the basis of the M estimates E'0m of its components in subbands.

Another set of modules 16 performs the decoding operations corresponding to the coding operations carried out in the first stage 6 of the coder. This set 16 comprises a decoding core 18 which is a standard decoder associated with the coding core 8. It reconstructs the synthetic signal S'0 of the synthetic analysis coder on the basis of the coding parameters QS0 extracted by the demultiplexer 15. The set 16 also comprises N decoding modules DS1–DSN which reconstruct the estimates S'1–S'N of the high band signals S1–SN on the basis of the coding parameters QS1–QSN extracted by the demultiplexer 15.

N+1 adders A0–AN produce the N+1 improved estimates S"0–S"N of the spectral components of the input signal which are submitted to a bank of recombining filters 14. The adder An ($0 \leq n \leq N$) performs the operation S"n=S'n+E'n. The bank of recombining filters 14 corresponds to the bank of separation filters 4 of the coder, It delivers the final estimate S" of the original audio signal.

The coder described above uses a main coding stage 6 and a stage 7 for enhancement by error quantification. Of course, it would be possible to provide other enhancement stages, a second improvement stage (that is to say a third stage of decoder) then performing vector quantification of the residual errors of the different coding modules in the second stage, and so on. Correspondingly, the associated decoder would then comprise other sets of decoding modules of the type in the set 17 shown in FIG. 2.

The method of bit allocation between the different coding modules depends on the application considered.

Bit allocation may be fixed, for example. Table I shows a numerical example of division of the output data stream binary rate between the different subbands and between the two stages of the coder (excluding the rate relating to the coding core). In this numerical example, N=4 and a base signal S0 in the band 0–4 kHz sampled at 8 kHz, are chosen. The input signal S therefore has a pass band of 8 kHz. The coding core 8 is for example a G.723 coder which processes the signal in elementary frames of 30 ms (240 digital samples of the base signal). The vector quantification operations are performed on windows of 60 samples, each divided into four segments of 15 samples. The windows are of 60 ms (two elementary frames of the G.723 coder) for modules CE01–CE08, and of 30 ms (one elementary frame of the coding core) for modules CS1–CS4 and CE1–CE4.

For each window, the numbers of bits per sub-band are: NE0m=NSn=NEn=56 for $1 \leq n \leq 4$, divided as follows:

- 6 scalar quantification bits GG of an average gain over the window;
- 6 vector quantification bits GR of four residual gains concerning the four segments of the windows respectively;
- 4×Q=40 bits IF constituting the waveform vector quantification indices, each index of Q=10 bits being the address, in the library of size $2^Q=1024$, of the waveform to be used for one of the segments; and
- 4 bits σ representing the signs allocated to the global gains (=average gain over the window+residual gains) relating to the four segments of the window.

| Sub-band (kHz) | 1st stage rate (kbit/s) | 2nd stage rate (kbit/s) | Total per sub-band (kbit/s) |
|---|---|---|---|
| 0–0.5 | — | 0.9333 | 0.9333 |
| 0.5–1 | — | 0.9333 | 0.9333 |
| 1–1.5 | — | 0.9333 | 0.9333 |
| 1.5–2 | — | 0.9333 | 0.9333 |
| 2–2.5 | — | 0.9333 | 0.9333 |
| 2.5–3 | — | 0.9333 | 0.9333 |
| 3–3.5 | — | 0.9333 | 0.9333 |
| 3.5–4 | — | 0.9333 | 0.9333 |
| 4–5 | 1.8667 | 1.8667 | 3.7333 |
| 5–6 | 1.8667 | 1.8667 | 3.7333 |
| 6–7 | 1.8667 | 1.8667 | 3.7333 |
| 7–8 | 1.8667 | 1.8667 | 3.7333 |
| TOTAL | 7.4667 | 14.9333 | 22.4 |

Bit allocation may also be changed as a function of the output rate σ of the coder, by adding or removing high frequency bands and/or improvement stages. This allows the coder to be matched to the decoder which will process its output data stream and to the pass band of the transmission channel. This is achieved very simply by cancelling some of the numbers of bits NEn, NSn or NE0m supplied to the coding modules.

Thus in the numerical example in Table I and with a coding core of type G.723, the coder may have a data rate range running from about 6.3 kbit/s to 28.7 kbit/s depending on the quality and/or the rate required. It will be noted that great flexibility and very fine adjustment is possible in matching the coder rate.

The allocation unit 10 may also examine the respective energies of signals E0m, Sn, CEn supplied to the coding modules in order not to transmit coding parameters of a signal which would be of negligible energy.

The coder may also be matched to different pass band widths and/or different sampling frequencies of the input signal S. For this, we can add high bands in the initial separation into sub-bands of signal S. The coding core used may itself be selected from among several standard coding cores (G.723, Tetra, MPEG-2, AAC etc.) provided in the audio coder, these different coding cores enabling signals of different pass bands and/or sampling frequencies to be processed.

When bit allocation is variable, it is necessary to include in the output data stream of the coder allocation bits indicating the sub-bands taken into consideration. These allocation bits may be placed in the header H of the data stream. They may also be placed with the corresponding quantification bits, as FIG. 3 shows.

Figure 3:
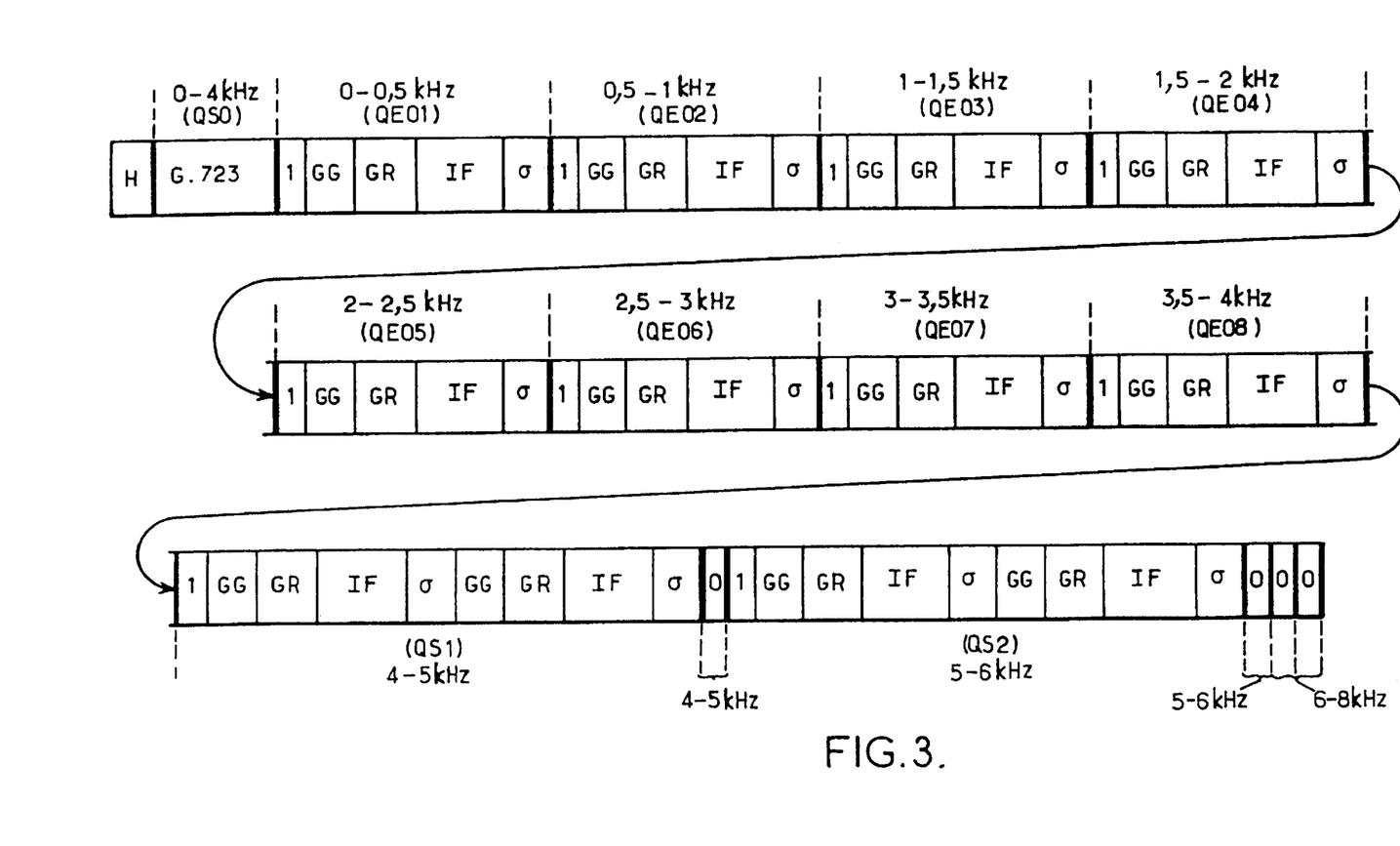
FIG. 3 is a diagram illustrating an example of a data stream structure which the coder in FIG. 1 can produce.

The example in FIG. 3 corresponds to a particular case in which bit allocation is such that the M=8 sub-bands resulting from the separation of the residual error E0 of the coding core 8, assumed to be of type G.723 (frames of 30 ms, i.e. 240 samples at 8 kHz), are taken into consideration, as are the two lowest sub-bands among the N=4 high sub-bands resulting from the separation of the input signal S (cf Table I).

The data stream shown in FIG. 3 corresponds to a time window of 60 ms. It is assumed that the coding process is in two stages, that is to say with a single enhancement stage. For example, the header H comprises four bits used to code the type of coding core used (G.723 at 6.3 kbits/s, 6.723 at 5.3 kbit/s, Tetra, CELP VM at 5.5 kbit/s etc.), to which is added a bit indicating the input signal sampling frequency (8 kHz or 16 kHz).

After the header H are found the bits representing the parameters QS0 supplied by the coding core according to the standard format. In the example considered, the window includes two G.723 frames, forming the contribution to the data stream of the base band 0–4 kHz for the first stage of coding.

The G.723 parameters are followed by fields relating to the sub-bands coming from the separation of the error signal E0 of the coder core, considered in ascending frequency order. Each of these fields relates to the second stage of the coder, and starts with the allocation bit. If this allocation bit has the value 1 (for each of the eight sub-bands in the case considered), the data stream includes coding parameters QE0m for the sub-band, and the bits representing these parameters GG, GR, IF and or follow the allocation bit, before moving to the next sub-band. If the allocation bit has the value 0, the subband concerned is not used, and the 0 allocation bit is directly followed by the field relating to the next sub-band.

After the fields relating to the M=8 sub bands of the error signal E0, the data stream comprises in succession the fields containing the information relating to the N−4 high bands of the input signal separation considered in ascending frequency order (these fields are absent if the header H indicates that the sampling frequency is 8 kHz only). Each of these fields refers to the first stage and where applicable the second stage of the coder, and begins with an allocation bit If this allocation bit has the value 0 (for the last two high bands in the case considered), the band concerned is not used, and the 0 allocation bit is followed directly by the field relating to the following band (it is not necessary to provide an additional allocation bit for the second stage). If the allocation bit has the value 1 (for the first two high bands in the case considered), the data stream includes two sets of coding parameters QSn of the first stage for the band in question, and the bits representing these parameters GG, GR, IF and σ follow the allocation bit (there are two sets of NS1=NS2=56 bits because the 60 sample quantification windows are of 30 ms only for the high bands); the data stream then comprises the additional allocation bit for the second stage which is followed in turn, where necessary, by the bits representing the coding parameters QEn relating to the second stage.

It will be noted that the format illustrated by FIG. 3 is suited to very varied contents of the data stream. It allows various coder cores to be taken into account, and very numerous possibilities in the allocation of the bits per sub-band, from which numerous possible rate values result. This data stream is known as "editable" insofar as it allows retrieval of the coded information piece by piece (band by band here). For example, if a decoder limited to a sampling frequency of 8 kHz receives the data steam shown in FIG. 3, which in principle is intended for a decoder operating at 16 kHz, it will nevertheless be able to reproduce a version of the coded audio signal simply by disregarding the information concerning the high bands.

With the values in Table I and a 6.3 kbit/s 6.723 coding core, the data stream shown in FIG. 3 codes the 60 ms signal window into A=1069 ordered bits, corresponding to a rate of 17.8 kbit/s. If the input signal is sampled at 8 kHz only, the corresponding bit in the header is changed, and the information concerning the high bands is deleted (last line in FIG. 3): the window is then of A=839 ordered bits, corresponding to a rate of 14 kbit/s. If an additional reduction in rate is necessary, the simplest solution is to delete the highest sub-band or bands in the separation of the error signal, which entails a certain degradation of quality. For example, if the rate has to be reduced to 12.9 kbit/s, the two highest sub-bands are deleted.

In one mode of embodiment of the invention, a reduction in rate results from deletion applied to certain bits only of one or more vector quantification indices.

As an example, the waveform quantification indices IF are considered below. It will be noted however that a similar method could be applied to any parameter vector which the decoder can retrieve on the basis of vector quantification indices picking out from predetermined libraries. In particular, it could be applied to the stochastic excitation vector used in coders of the CELP type or similar.

For each segment of a signal E0m, Sn or En undergoing vector quantification, the coder is capable of producing the address, represented by an index IF of Q=10 bits (example in Table I) which designates in the reference library of $2^Q$ vectors the waveform of 60 samples considered as optimum in the sense of minimising the quantification error on a training corpus.

if only Q−p bits of this index IF ($1 \leq p < Q$) are transmitted to the decoder, this will know that the address of the vector selected by the coder is part of a group of $2^{Q-p}$ addresses represented by the different indices of Q bits which share the Q−p bits received. The coder will then be able either to choose one of the vectors picked out by the $2^{Q-p}$ addresses of the group, or to calculate an average to obtain the waveform used to reconstruct the signal.

More generally, the transmitted indices of Q−p bits are obtained by truncating p bits of determined positions in the indices of Q bits which correspond to the addresses of the reference library by an arbitrary permutation (known by the transmitter and the receiver) in the interval $[0, 2^Q]$. Without restricting generality, we may study the case in which the truncated bits are the last p (least significant) bits of the indices.

This truncating can be carried out either by the coder at the origin of the digital data stream Φ (then the allocation unit 10 only has to supply the relevant bit numbers to the coding modules CSn, CEn or CE0m), or by an intermediate transcoder receiving the original data stream Φ (or a data stream already transcoded) and transforming it into a lower rate data stream Φ'. Truncating is carried out for one or more of the quantification vectors, or indeed for all. The coder or transcoder which performs this may include in the digital data stream, for example in the headers H, information describing the changed structure of the data stream in terms of numbers of bits of the different indices, unless this information is already known by the decoder.

This method of proceeding secures a far finer rate adjustment than when only the number of sub-bands taken into consideration is adjusted.

The case considered first is one in which the permutation mentioned in the interval [0, $2^Q$] is identity, the non-truncated index being equal to the address of the vector selected by the coder. The contrary case, where a transcoding table or relation is used to give an account of the permutation, will be considered later.

It is possible to adopt appropriate ordering of the reference library to ensure that, for one or more values of the integer p the $2^p$ vectors designated by the addresses of the group are close to each other in the sense of a distance criterion, so as to minimise the impairment of the decoded signal which may be caused by the reduction in the number of bits of the index transmitted.

There are various conventional methods of constructing reference libraries for vector quantification processes, defined to model in an optimum way the form of the signal to be quantified. For example the LBG method is used to obtain for different values of the integer Q, libraries of size $2^Q$ which minimise the root-mean-square error when quantifying a corpus of representative signals.

Figure 4:
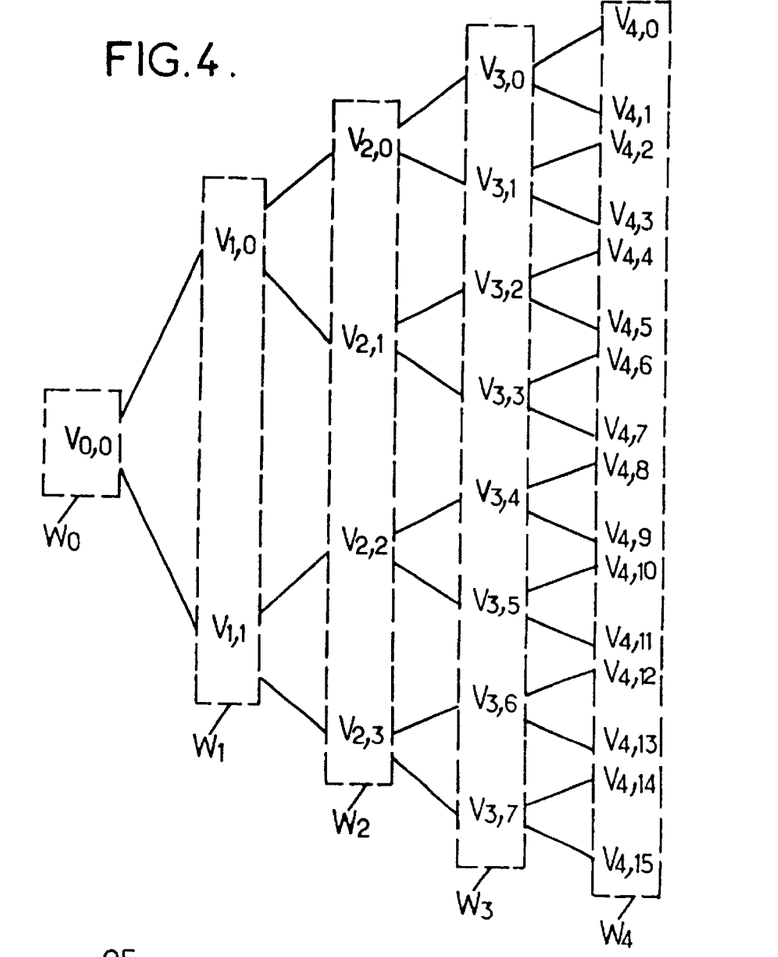
FIG. 4 is a diagram illustrating the construction of vector quantification libraries which can be used in methods according to the invention.

Libraries of this kind can be generated by a tree structure procedure illustrated in FIG. 4. This Figure shows that the libraries Wi each composed of $2^i$ vectors $V_{ij}$ ($0 \leq j < 2^i$) generated iteratively on the basis of i=0 so that their linear combinations best cover the space of the signals to be quantified. For each value of $i_j$, the vectors $V_{j+1,2j}$ and $V_{j+1,2j+1}$ are derived from the parent vector $V_{ij}$ to which they are closest. Once Q iterations have been carried out, the library $W_Q$ is adopted as reference library and the j indices of the vectors $V_{Qj}$ as addresses. This known construction of libraries is generally used with the aim of speeding up the search for the optimum vector, by searching from the root to the branches of the tree, which makes it necessary for the coder to store at least part of the intermediate libraries $W_j$ (j<Q) in addition to the library $W_Q$. In this application, this construction is used to make sure that, for any value of p, the $2^p$ vectors designated by the addresses of the group of $2^p$ addresses sharing their Q-p most significant bits are relatively close to each other, which minimises the distortions caused by transmission of a limited number of bits of the index.

The decoding module DSn, DEn or DE0m receiving the Q-p bits of the truncated index can complete them by p bits of arbitrary values instead of the missing p bits to form the access address in the reference library.

If the spectrum of the quantified signal is blank, which is approximates well to the case with the residual error signals E0m and En, it then has one chance out of $2^p$ of using the optimum vector. To limit bias, it is preferable to draw at random the p bits added to the index received.

In some cases, the p bits added to the index received by the decoder may be of predetermined values, for example 00 . . . 0. This may be the case if the vector quantification module CSn, CEn or CE0m of the coder selects the coding parameter vector from a sub-library of $2^{Q-p}$ vectors included in the reference library, containing only the vectors having an address which ends in p zero bits. The Q-p bits of the index transmitted, completed by p zero least significant bits then represent the address of the vector selected from the reference library.

Another possibility for the decoding module DSn, DEn or DE0M of the decoder, receiving an index of Q-p bits only, is to calculate to form its output signal an average of the $2^p$ vectors having addresses which begin with these Q-p bits.

If the statistics of the quantification signal are uniform, it is desirable that this average should be uniform, i.e. not weighted.

If the statistics of the quantified signal are not uniform, which may be the case for example for the signals S1-SN in the coder in FIG. 1, weighting will preferably be used in the calculation of the average by the decoder. In this case, a database representative of the statistics of the signals processed is used beforehand to associate with each vector in the library a coefficient representing the theoretical probability of its occurrence. As these coefficients are fixed, it is then possible to use them to weight the averages so as to limit the distortions due to deletion of certain bits of the data stream.

To obtain the waveform, it is also possible for the decoder to adopt a method which takes account of information on the coded signal.

This information may in particular refer to the steady-state or non-steady state character of the signal. It may either be transmitted by the coder in the digital data stream, for example in the header H, or obtained by the decoder by an analysis after the event of the decoded signal. Methods of analysing the steady-state character of the signal, for example of voiced/unvoiced detection, are well known in the field of speech coding.

Several tables of weighting coefficients associated with the vectors in the reference library may be drawn up beforehand, for example one table representative of the statistics of signals of the steady-state type, and another table representative of the statistics of signals of the non-steady-state type, and a choice made dynamically of the table used to retrieve the coefficients for weighting the average on the basis of the information on the steady-state nature of the signal.

Where the vector is simply selected from the group of $2^p$ vectors, the selection may also be different depending on information on the signal such as the degree to which it is steady-state.

Another analysis which the decoding module may carry out in connection with retrieval of the coding parameter vector is based on predicting this vector. Thus the sequence of the vectors retrieved by the decoding module concerned for the successive time windows can be subjected to linear prediction in order to obtain a predicted vector for the current window. Two possibilities are then offered: to adopt the one of the $2^p$ vectors in the group having addresses which begin with the Q-p bits of tile index received which shows maximum similarity with, or a minimum distance from, the predicted vector; or to take account of this predicted vector in assigning weighting coefficients if a weighted average calculation is carried out, a maximum weighting being then assigned to the one of the $2^p$ vectors which shows maximum similarity with the predicted vector.

The different methods which have been described above for obtaining the vector on the basis of the incomplete index may coexist in the same decoder, and be selected on the basis of information contained in the data stream or transmitted in a report prior to the communication. Moreover, as each vector is formed by a respective decoding module DSn, DEn or DE0m, provision can be made for different methods to be applied by these modules to obtain the vector on the basis of the incomplete index. Furthermore, the different coding and decoding modules associated could use different reference libraries.

Figure 5:
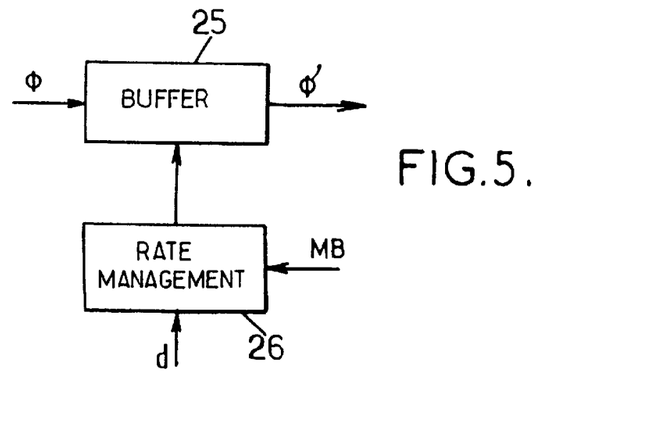
FIGS. 5 and 6 are up block diagrams of examples of transcoders according to the invention.
Figure 6:
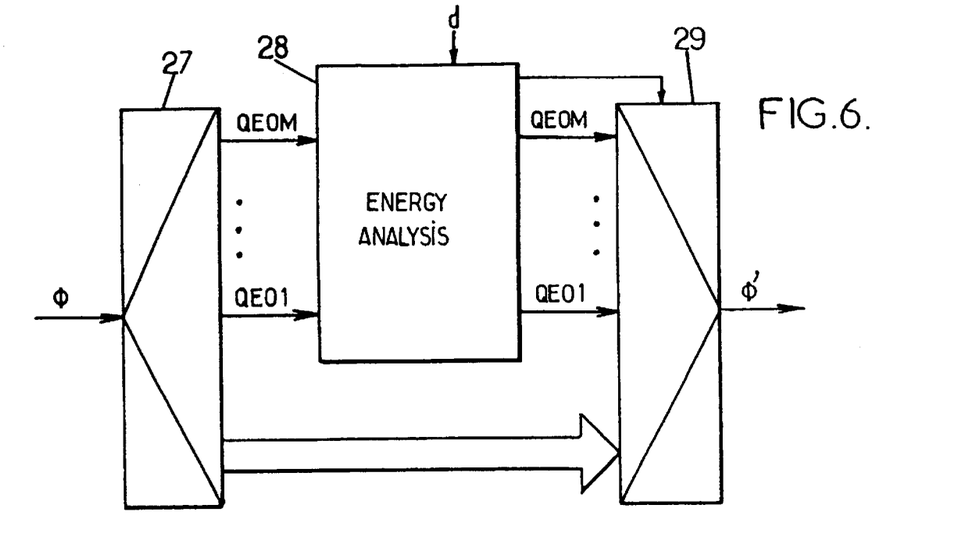

FIGS. 5 and 6 are block diagrams of transcoders which can delete certain bits of one or more indices.

It should be noted that the input data stream Φ of the transcoder may already have had the least significant bits of some of the vector quantification indices deleted, either by the coder at the origin of the data stream or by another intermediate transcoder. An index of Q–q bits of the input data stream Φ (with Q≧0 in the general case) is thus reduced to an index of Q–p bits, with p>Q, in the output data stream Φ' of the transcoder.

In the architecture of FIG. 5, the input digital data stream Φ is written to a buffer memory 25. Parts of this are then read into the memory 25 to form the output data stream Φ'. Monitoring of the bits read and deleted is carried out by a rate management unit 26 receiving an output rate value d to be complied with. As a function of the rate d, the unit 26 determines which bits are to be deleted. As an example, for decreasing values of d, it may begin by deleting one bit per coding module, starting, depending on the composition of the input data stream Φ, with the last stages of the coder and the highest sub-bands. Of course, other strategies for choosing the deleted bits would be applicable. As shown in FIG. 5, the transcoder could also receive messages MB from the receiver in order to take account of this in the construction of the output data stream Φ.

In the architecture in FIG. 6, the transcoder comprises an input demultiplexer 27 which receives the input data stream Φ and separates certain quantification indices (indices QE0m only in the example in the drawing) from the rest of the data stream. An energy analysis unit 28 examines the indices QE0m and deletes certain bits of these before supplying the truncated indices to an output multiplexer 29 which, with the other elements of the input data stream Φ, forms the output data stream Φ'.

For each set of indices QE0m=(GG, GR, IF, σ), the unit 28 estimates the energy of the quantified signal, measured by the indices of gains when the waveforms are standardised. Depending on the output rate d required, it deletes bits of the quantification indices IF of the waveforms, starting with those belonging to the sets of indices for which the estimated energies are lowest. Thus, from the array of spectral components, one or more components having energies which are minimum are selected in order to replace the index IF of the sector of quantification indices associated with each components selected by a truncated index.

It will be noted that the coder could adopt a strategy of this kind from the outset.

A decoder receiving the output data stream Φ constructed in this way estimates the energies on the basis of the gain indices (which are not changed) in the same way, which enables it to identify the sub-bands for which bits of the indices IF have been deleted. The input demultiplexer 15 of this decoder is associated with an energy analysis unit of the same kind as the unit 28 in FIG. 6. The energy analysis unit of the decoder, which may be part of the bit allocation unit in the diagram in FIG. 2, receives the gain indices GG GR, σ for the different quantified components in order to identify the components with least energy and assign a reduced number of bits to their quantification indices of form IF. It controls the input demultiplexer 15 and the decoding modules DSn, DEn, DE0m so that the bits of the indices are suitably distributed. For the decoder to be able correctly to identify the indices received, it is necessary to change the ordering of the bits in the data stream compared with the structure shown in FIG. 3, for example so as to place the gain indices GG, GR, σ before the form indices IF.

This method of operating coding/transcoding and decoding directs the errors towards the portions of the signal with the least energy, which limits perception of the distortions.

The transcoder in FIGS. 5 or 6 can in particular be placed at a node in a telecommunications network used to transmit the digital data stream. The input digital data stream Φ is then received on a link of the network, and the output digital data stream Φ' is retransmitted on another link of the same network, or a link of a different network in the case of a bridge. The network in question may in particular be a packet switching network, such as an Internet or ATM network. In network of this kind, it is desirable to be able to match dynamically, and preferably with fine adjustment, the transmission rate to avoid transmission delays due to congested traffic, delays which are generally not acceptable for audio signals.

In certain applications, the transcoding may also be located at the place from which the coded signal originates. It may in particular be associated with an audio server, as shown schematically in FIGS. 7 or 8.

Figure 7:
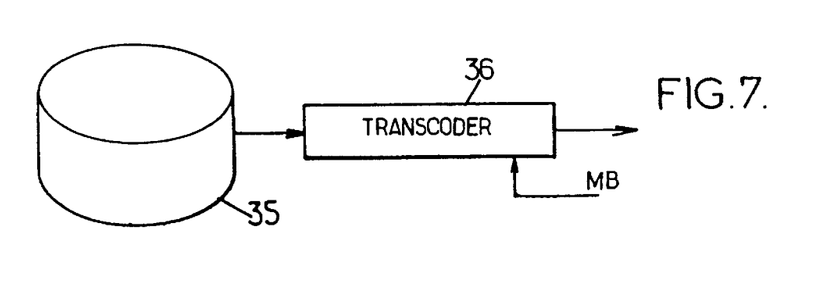
FIGS. 7 and 8 are two diagrams illustrating the utilization of this invention in an audio server.

In the example in FIG. 7, a memory 35 of the audio server contains a number of signal sequences coded beforehand at the maximum rate of the coding process (in the example considered above: NE01= . . . =NE0M=NS 1= . . . =NSN= NE 1 = . . . =NEN=56).

When the server is to produce a given sequence intended for a decoder, having for example announced its relevant characteristics in a message MB (and/or indicated the sub-bands for which bits can be deleted), the transcoder 36 obtains the fill rate data stream read from the memory 35 and, to transmit at a lower rate, deletes quantification bits determined as described previously.

Figure 8:
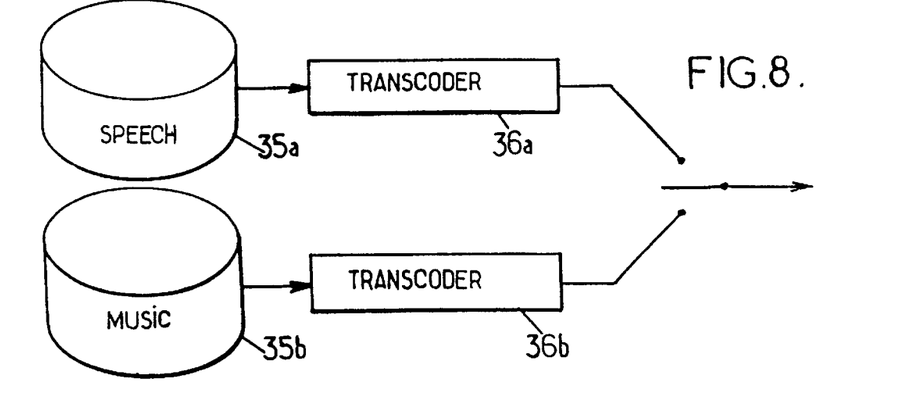

The bits deleted may also be chosen as a function of the origin of the coded signal. Thus FIG. 8 shows another audio server in which transcoders employ the invention without necessarily analysing the data streams transmitted or receiving messages ME from a decoder. In the example in FIG. 8, the server memory is divided into two areas, one 35a in which the sequences coded at full rate corresponding to speech signals have been recorded, and the other 35b in which the sequences coded at fall rate corresponding to music signals have been recorded. Each sequence read from zone 35a is submitted to a transcoder 36a which reduces its rate when necessary, by giving priority to deletion of bits relating to the sub-bands from separation of the error signal E0. Conversely, the sequences read from zone 35b are submitted to a transcoder 36b which, when necessary, deletes quantification bits preferentially in the high bands in order to give priority to the correction of distortions which the coding core may have introduced into the base band.

The coding or transcoding method according to which a number of bits Q–p smaller than the number of bits Q of the addresses of the vectors in the reference library are transmitted, may also be applied to the coder core, or more generally to any waveform coder using a library, for example CELP or other. These coders are developed in connection with applications in which this invention is not normally taken into account. This leads to reference libraries with an ordering which does not necessarily fulfil the condition of small distances between vectors having addresses which share their most significant bits.

Starting from a reference library of this kind of size $2^Q$, we may order the vectors which compose it so as to associate with them respective indices of Q bits in addition to their addresses in the library, leading to verification of a minimum distance criterion between the vectors belonging to each group of $2^p$ vectors of the library having indices of Q respective bits which differ only in the p least significant bits. This ordering can be carried out for only one or for several values of the integer p. It leads to the definition of one or more transcoding relations or tables determining an index of Q bits to represent the address on Q bits of each vector in the library. This table is such that the vectors of each group of $2^p$ vectors, having addresses which are represented by $2^p$ indices of Q bits differing from each other only by their p least significant bits, are relatively close to each other.

Finding the permutation which strictly minimises the distances within the set of the possible groups of $2^p$ vectors is a difficult optimisation problem which requires an enormous quantity of calculations. We may however identify less than optimum solutions which can be used in practice. As an example, we may proceed as follows:

/a/ take the list of the addresses of Q bits from the initial library to be re-ordered as set A={0, 1, . . . $2^Q-1$};

/b/ for k ranging from 0 to $2^{Q-p}$, do the following:

/b1/ draw at random from the set A an address $b(k.2^p)$;

/b2/ remove $b(k.2^p)$ from set A;

/b3/ for h ranging from 1 to $2^p-1$, do the following:

/b3.1/ choose from the set A the address $b(k.2^p+h)$ which designates the vector the distance of which to the vector designated by the address $b(k.2^p)$ is minimum;

/b3.2/ remove $b(k.2^p+h)$ from set A;

/c/ store the list of translated indices B={b(0), b(1), . . . $b(2^Q-1)$}.

We may execute the algorithm above a large number of times and finally adopt that of the lists B for which the distortion calculated, over a corpus of representative signals, applying the above rate reduction method, is minimum.

The transcoding table used by the decoder associates the address (b(j')) to each integer j' within the range 0 and $2^Q-1$ forming an index of Q bits. The coder or the transcoder uses the reverse table, which associates with each address j of Q bits, initially supplied by the normal coding process, the index $b^{-1}(j)$ such that $b[b^{-1}(j)]=j$. Truncation of p least significant bits of the index $b^{-1}(j)$ then leads only to limited errors in the coding vector being obtained by the decoder.

It will be noted that numerous variants may be applied to the library re-ordering algorithm set out above. For example, if $p \geq 2$, we could choose the address $b(k.2^p+h)$ at stage /b3.1/ as designating the vector for which the sum of the distances to the vectors designated respectively by the addresses $b(k.2^p)$ to $b(k.2^p+h-1)$ is minimum.

Figure 9:
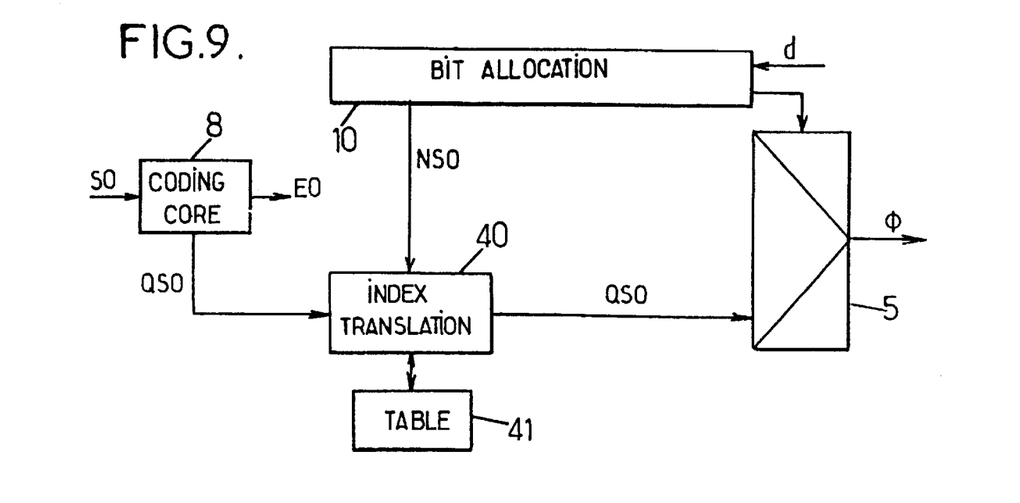
FIGS. 9 to 12 are partial block diagrams of a coder, decoder and two transcoders using transcoding tables.
Figure 10:
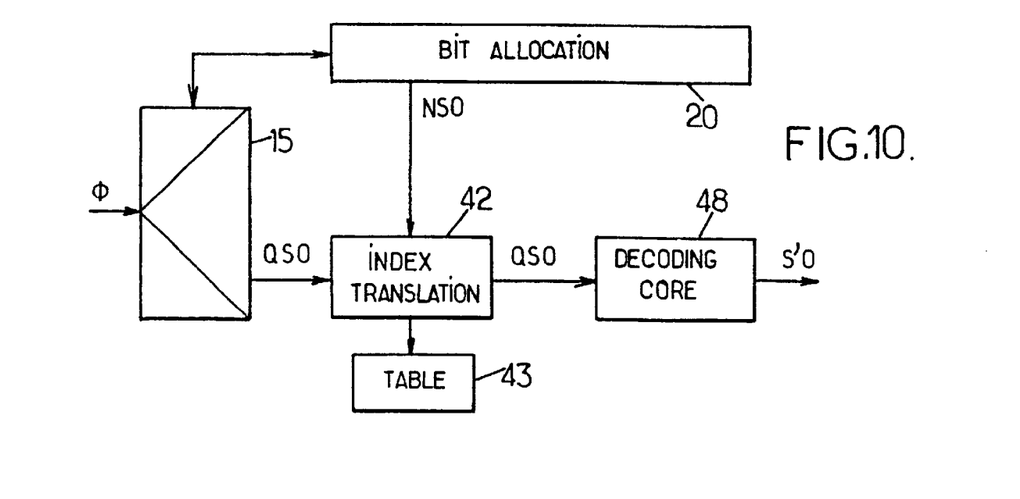
Figure 11:
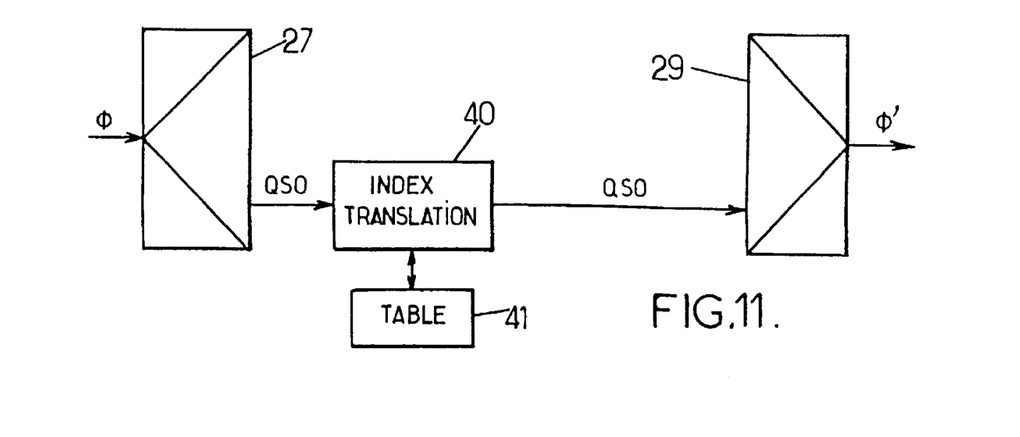

FIGS. 9, 10 and 11 show schematically variants of the coder, decoder and transcoder in FIGS. 1, 2 and 5, using transcoding tables as described above. The items not directly concerned by these tables have not been re-drawn.

In the coder in FIG. 9, the quantification indices delivered normally by the coding core 8 are supplied to a module 40 for translation of the CELP stochastic excitation index. This module 40 receives from the allocation module 10 a number of bits NSO which takes account, as far as the excitation vector selected from the CELP library is concerned, of a number of bits Q−p smaller than the number of bits Q of the addresses used in this library ($p \geq 1$). The module 40 looks up the transcoding table 41 to retrieve the index of Q bits $b^{-1}(j')$ representing the address j received from the coding core 8 among the parameters QS0. It removes the p least significant bits of this index $b^{-1}(j)$ to form the index included in the output digital data stream (D formed by the multiplexer 5.

Before reaching the decoder, this digital data stream Φ may possibly undergo intermediate transcoding comprising the deletion of one or more other least significant bits of the index relating to the CELP excitation vector, by a transcoder of the type described previously.

In the decoder shown in FIG. 10, the indices QS0 concerning the decoding core, including the index truncated by the module 40 of the coder, are supplied to another translation module 42. This looks up the transcoding table 43 to retrieve one or more addresses of Q bits b (j').

The module 42 of the decoder may operate by selecting a vector from anong the group of $2^p$ CELP vectors having addresses which are represented by the $2^p$ possible values of the index j', according to the same methods of selection as previously. The address of this vector is then supplied to the decoding core 18 which operates conventionally.

The module 42 may also cooperate with the decoding core 18 to work by averaging, uniform or weighted, of the $2^p$ vectors of this group, according to the same methods of weighting as previously.

The method of selection or averaging employed can also be chosen dynamically.

In the transcoder in FIG. 11, a translation module 40 identical to the one in the coder in FIG. 9 receives the indices QS0 supplied by the input demultiplexer 27, which have been obtained without transcoding by the coder 8. These indices comprise an index of Q bits equal to the address of the vector selected from the CELP library. The module 40 looks up the transcoding table 41 on the basis of this address to retrieve the corresponding index of Q bits, and removes from it the p least significant bits before re-transmitting it to the multiplexer 29 which forms the output data stream Φ'. This data stream Φ' may be processed by the decoder in FIG. 10.

Figure 12:
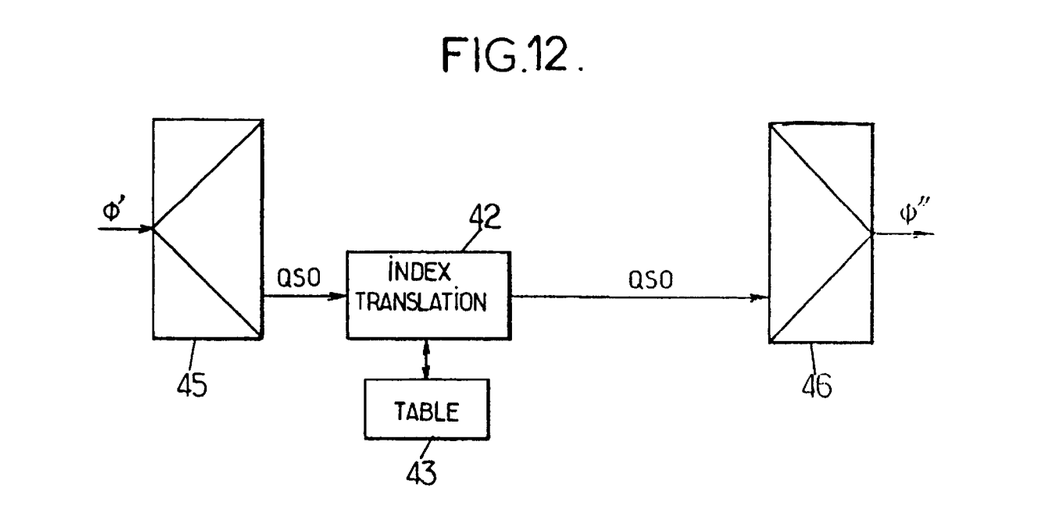

FIG. 12 shows another transcoder operating transcoding which is the reverse of that in FIG. 11. It receives an input data stream Φ' of reduced rate, for example in that the index relating to the CELP excitation vector has Q−p bits instead of Q, and it delivers a data stream Φ" of a higher rate in which this index has been reduced to Q bits. The input data stream Φ' may have been produced by a coder according to FIG. 9 or by a transcoder according to FIG. 11. The input demultiplexer 45 extracts the index of Q−p bits forming part of the parameters QS0 identical to the one in the decoder in FIG. 10, which looks up a transcoding table 43. The module 42 of the transcoder does not cooperate with a decoding core, so that it is arranged to employ one or more of the vector selection methods described previously (and not an averaging method), so that the vector selected according to one or other method can be designated by its address in the output data stream Φ" delivered by the multiplexer 46.

An important advantage of the coder, decoder and transcoders described with reference to FIGS. 9 to 12 is that they enable the desired scalability to be achieved, and this is also the case for coders or decoders which were not designed for this purpose.

For example, a pre-existing coder with fixed output rate will be able to transmit to a transmission channel portions of which permit, permanently or temporarily, only low rates. All that is required for this is that a transcoder of the type shown in FIG. 11 should be situated at the output of this coder or at a node of the network located upstream from the lower rate portions.

Similarly, a pre-existing decoder with fixed input rate will be able to receive via a transmission channel of this kind. All that is required for this is that a transcoder of the type shown in FIG. 12 should be located at the input to this decoder or at a node in the network located downstream of the lower rate portions.

Furthermore, two modes of operation may be provided for coders and decoders of this kind. In the first mode, the coder truncates to Q−p bits the index of the CELP excitation vector as explained above, and the decoder reconstitutes an excitation on the basis of the truncated index. In the second mode, the coder and decoder operate as an ordinary CELP coder and decoder, with direct transmission of the addresses over Q bits instead of the truncated indices. The codec can then adopt one or other of the two modes of operation depending on the capabilities of the other codec with which it communicates and/or according to the characteristics of the transmission channels used.

In the first mode of operation, the p bits retrieved from the digital data stream rate may be used for an actual reduction in the communication rate. Another possibility which may be envisaged is to use this capability to transmit other information to the decoder. In this case, for the time window in which truncation is applied, the coder inserts into the output digital data stream p' bits of additional information (0<p'≦p), which the decoder receives and utilizes as appropriate.

The above considerations relating to the reduction in the number of bits of one or more quantification indices apply to a codec structure the principle of which is illustrated by FIGS. 1 and 2, and in a similar manner to any codec structure generating one or more parameters quantified vectorially. If we consider audio coders alone, mention may be made of systems in which gains, waveforms and/or frequency components of the signal are quantified vectorially. The process is therefore applicable to CELP codecs and derivatives, MP-LPC (Multi-Pulse Linear Prediction Coding), in sub-bands,MBE (Multi-Band Excited) etc. It is also applicable to the coding of other signals, in particular video.

[Figure Captions:]

FIG. 1
  ALLOCATION DE BITS BIT ALLOCATION
  BANC DE FILTRES FILTER BANK
  NOYAU CODEUR CODING CORE
FIG. 2
  ALLOCATION DE BITS BIT ALLOCATION
  BANC DE FILTRES FILTER BANK
  NOYAU DÉCODEUR DECODING CORE
FIG. 5
  TAMPON BUFFER
  GESTION DEBIT RATE MANAGEMENT
FIG. 6
  ANALYSE ÉNERGIES ENERGY ANALYSIS
FIG. 7
  TRANSCODER TRANSCODER
FIG. 8
  TRANSCODER TRANSCODER
  PAROLE SPEECH
  MUSIQUE MUSIC
FIG. 9
  ALLOCATION DE BITS BIT ALLOCATION
  NOYAU CODEUR CODING CORE
  TRADUCTION INDICE INDEX TRANSLATION
  TABLE TABLE
FIG. 10
  ALLOCATION DE BITS BIT ALLOCATION
  NOYAU ÉTCODEUR DECODING CORE
  TRADUCTION INDICE INDEX TRANSLATION
  TABLE TABLE
FIG. 11
  TRADUCTION INDICE INDEX TRANSLATION
  TABLE TABLE
FIG. 12
  TRADUCTION INDICE INDEX TRANSLATION
  TABLE TABLE

What is claimed is:

1. A method for coding a signal in which a selection is made, on the basis of a portion of the signal (S), of at least one coding parameter vector belonging to a reference library containing $2^Q$ vectors each designated by an address of Q bits and an output digital data stream ($\Phi$) is formed containing an index deduced from the address of the vector selected from the reference library, wherein the output digital data stream has a rate which can be adjusted by varying the number Q−p of bits forming this index contained in the digital data stream, and wherein, for each rate value corresponding to a value of the integer p≧0, the index contained in the digital data stream is formed of Q−p bits which, completed by p arbitrary bits of predetermined positions, define indices of Q bits representing a group of $2^p$ addresses including the address of the vector selected from the reference library.

2. A coding method according to claim 1 in which information representative of the number Q−p of bits forming the index mentioned is included in the output digital data stream ($\Phi$).

3. A coding method according to claim 1, in which the coded signal is an audio signal coded in sub-bands, in which at least some of the sub-bands undergo dynamic bit allocation causing variation in the number of index bits associated with parameter vectors selected in relation to these sub-bands.

4. A coding method according to claim 1, in which, for at least one rate value corresponding to a value of the integer p>0, the reference library is ordered so as to verify a criterion of minimum distances between the vectors belonging to each group of $2^p$ vectors in the reference library, having respective addresses which differ only in the p bits having the predetermined positions mentioned.

5. A coding method according to claim 4 in which, for a value of the integer p>0 mentioned, the coding parameter vector is selected from a sub-library of $2^{Q-p}$ vectors included in the reference library, and in which the Q−p bits of the index, completed by p bits of predetermined positions and values, represent the address of the vector selected from the reference library.

6. A coding method according to claim 1, in which a transcoding table (41) is looked up on the basis of the address of the vector selected from the reference library to obtain a first index of Q bits, and in which, for each rate value corresponding to a value of the integer p≧0, the index contained in the output digital data stream ($\Phi$) is formed of Q−p bits extracted from the first index mentioned of Q bits excluding p bits of predetermined positions.

7. A coding method according to claim 6, comprising a first mode of operation in which, for each rate value corresponding to a value of the integer p≧0, the index contained in the output digital data stream ($\Phi$) is formed of the Q−p bits extracted from the first index of Q bits mentioned, and a second mode of operation with a defined rate in which the address of the vector selected from the reference library is included in the output digital data stream instead of the index formed of Q−p bits.

8. A coding method according to claim 7 in which, for at least one rate value corresponding to a value of the integer p>0 in the first mode of operation, there is included in the output digital data stream ($\Phi$) a number p', at most equal to p, of bits of additional information replacing p' of the p bits excluded from the first index of Q bits mentioned.

9. A coding method according to claim 6 in which, for at least one rate value corresponding to a value of the integer p>0, the transcoding table (41) is organized so as to verify a criterion of minimum distances between the vectors belonging to each group of $2^p$ vectors of the reference library having respective addresses which correspond, via the transcoding table, to first indices of Q bits which differ only in the p bits having the predetermined positions mentioned.

10. A coder comprising means of signal processing using a coding method according to claim 1.

11. A method for decoding a digital data stream ($\Phi$) representative of a coded signal, the digital data stream containing, for a portion of the signal, at least one index making it possible to obtain, by means of a reference library containing $2^Q$ vectors each designated by an address of Q bits, a coding parameter vector used to construct a decoded version (S") of the portion of signal mentioned, wherein the digital data stream rate depends on the number Q−p of bits forming the index mentioned, and wherein, for each rate value corresponding to a value of the integer $p \geq 0$, the coding parameter vector is obtained on the basis of at least one vector in the reference library having an address which belongs to a group of $2^p$ addresses respectively represented by indices of Q bits formed by completing with p arbitrary bits of predetermined positions the index of Q−p bits contained in the digital data stream.

12. A decoding method according to claim 11, in which the number Q−p of bits forming the index mentioned is determined according to information read from the digital data stream.

13. A decoding method according to claim 11, comprising a mode of operation by vector selection in which, for at least one rate value corresponding to a value of the integer p>0, the coding parameter vector is obtained by selecting from the reference library a vector having an address which belongs to the group of $2^p$ addresses mentioned.

14. A decoding method according to claim 13, comprising a version of the mode of operation by vector selection in which the p bits completing the Q−p bits of the index contained in the digital data stream ($\Phi$) to represent the address of the vector selected are bits of predetermined values.

15. A decoding method according to claim 13, comprising a version of the mode of operation by vector selection in which the p bits completing the Q−p bits of the index contained in the digital data stream ($\Phi$) to represent the address of the vector selected are drawn at random.

16. A decoding method according to claim 13, comprising a version of the operating mode by vector selection in which the coding parameter vector is obtained by selecting it from among the vectors in the reference library having respective addresses which belong to the group of $2^p$ addresses mentioned, on the basis of information on the coded signal.

17. A decoding method according to claim 16, in which the information on the coded signal mentioned is read from the digital data stream ($\Phi$).

18. A decoding method according to claim 16, in which the information mentioned on the coded signal is obtained by analysis of the decoded version of the signal.

19. A decoding method according to claim 18, in which the analysis mentioned comprises a prediction of the coding parameter vector on the basis of the parameter vectors obtained for previous portions of the signal, and in which the vector selected has maximum similarity to the vector predicted from among the vectors in the reference library having respective addresses which belong to the group of $2^p$ addresses mentioned.

20. A decoding method according to claim 11, comprising a mode of operation by vector averaging in which, for at least one rate value corresponding to a value of the integer p>0, the coding parameter vector is obtained by making an average of several vectors in the reference library having respective addresses which belong to the group of $2^p$ addresses mentioned.

21. A decoding method according to claim 20, comprising a version of the mode of operation by vector averaging in which the average made to obtain the coding parameter vector is a uniform average of the vectors in the reference library having respective addresses which belong to the group of $2^p$ addresses mentioned.

22. A decoding method according to claim 20, comprising a version of the mode of operation by vector averaging in which the average made to obtain the coding parameter vector is a weighted average of the vectors in the reference library having respective addresses which belong to the group of $2^p$ addresses mentioned, with respective weightings assigned.

23. A decoding method according to claim 22 in which the weightings mentioned are fixed coefficients assigned to the vectors in the reference library in a manner representative of their theoretical probabilities of occurrence.

24. A decoding method according to claim 22 in which the weightings mentioned are coefficients determined on the basis of information on the coded signal.

25. A decoding method according to claim 24 in which the information on the coded signal mentioned is read from the digital data stream ($\Phi$).

26. A decoding method according to claim 24 in which the information on the coded signal mentioned is obtained by analysis of the decoded version of the signal.

27. A decoding method according to claim 26 in which the analysis mentioned refers to the degree to which the signal is steady-state.

28. A decoding method according to claim 26 in which the analysis mentioned comprises a prediction of the coding parameter vector on the basis of the parameter vectors obtained for previous portions of the signal, and in which a maximum weighting is assigned to the vector which, among the vectors of the reference library having respective addresses which belong to the group of $2^p$ addresses mentioned, shows maximum similarity with the predicted vector.

29. A decoding method according to claim 11 in which a transcoding table (43) is looked up on the basis of at least one of the indices of Q bits mentioned formed by completing the index of Q−p bits contained in the digital data stream ($\Phi$) to obtain at least one of the $2^p$ addresses of the group mentioned.

30. A decoding method according to claim 29, comprising a first mode of operation in which, for each rate value corresponding to a value of the integer $p \geq 0$, the coding parameter vector is obtained on the basis of at least one vector in the reference library the address of which is obtained by looking up the transcoding table (43), and a second mode of operation with defined rate in which the index contained in the digital data stream ($\Phi$) is of Q bits and the coding parameter vector is obtained as being the vector with an address equal to the index, already mentioned, of Q bits in the reference library.

31. A decoding method according to claim 30 in which, for at least one rate value corresponding to a value of the integer p>0 in the first mode of operation, p bits of additional information are received in the digital data stream ($\Phi$).

32. A decoder comprising means for signal processing employing a decoding method according to claim 11.

33. A method for transcoding an input digital data stream ($\Phi$) representative of a signal coded by means of at least one reference library containing $2^Q$ coding parameter vectors each designated by an address of Q bits, to form an output digital data stream ($\Phi'$) with a lower rate, in which the input digital data stream ($\Phi$) contains, for a portion of the signal, at least one index of Q bits which is equal to the address in the reference library of a selected coding parameter vector, in which a transcoding table (41) is looked up on the basis of the address, already mentioned, of the vector selected to obtain another index of Q bits, and in which, in the output data stream, the index of Q bits contained in the input data stream ($\Phi$) is replaced by a translated index of Q–p bits which, completed by p arbitrary bits of predetermined positions, define indices of Q bits representing a group of $2^p$ addresses including the address, already mentioned, of the vector selected, p being an integer such that 0<p<Q, this translated index of Q–p bits being formed of Q–p bits extracted from the other index, already mentioned, of Q bits by excluding bits of predetermined positions.

34. A transcoding method according to claim 33 in which information representative of the number Q–p of bits forming the translated index is included in the output digital data stream ($\Phi'$).

35. A transcoding method according to claim 33 in which the input digital data stream ($\Phi$) is read from a memory of an audio server.

36. A transcoding method according to claim 33 in which the input digital data stream ($\Phi$) is received on a link of a telecommunications network and the output digital data stream ($\Phi'$) is retransmitted on another link of the network or on a link of another network.

37. A transcoding method according to claim 33, in which the coded signal is an audio signal (S), in which the input digital data stream ($\Phi$) includes sets of quantification indices associated with a group of respective spectral components, each set of indices associated with a component of the set comprising at least one index which can be translated by reducing its number of bits and enabling a coding parameter vector to be found.

38. A transcoding method according to claim 37, in which the spectral components or components associated with the sets of quantification indices comprising an index replaced by a translated index in the output data stream ($\Phi'$) are chosen according to the origin of the coded audio signal.

39. A transcoding method according to claim 37 in which the spectral component or components associated with the sets of quantification indices comprising an index replaced by a translated index in the output data stream ($\Phi'$) are chosen according to the characteristics of a decoder for which the output digital data stream is intended.

40. A transcoding method according to claim 37 in which the input digital data stream ($\Phi$) is analysed to select, from the group of the spectral components, at least one component of minimum energy, and in which an index of the set of quantification indices associated with each component selected is replaced by a translated index.

41. A transcoding method according to claim 40 in which the audio signal (S) is coded by successive time windows which are each composed of one or more successive time segments, each time segment of a spectral component being obtained by the product of a waveform belonging to a library and a gain, each set of quantification indices associated with a component of the group comprising indices (IF) identifying the waveforms and indices (GG, GR, σ) identifying the corresponding gains, and in which the analysis of the input digital data stream ($\Phi$) concerns the indices of gains relating to the components of the group, the component or components for which the gains identified by these indices are lowest being selected.

42. A transcoding method according to claim 41, in which the indices (IF) identifying the waveforms for components of the group are translatable indices.

43. A transcoding method according to claim 33, in which there is included in the output digital data stream ($\Phi'$) a number p', at most equal to p, of bits of additional information replacing p' of the p bits excluded from the other index of Q bits already mentioned.

44. A transcoding method according to claim 33, in which the transcoding table (41) is organized so as to verify a criterion of minimum distances between the vectors belonging to each group of $2^p$ vectors in the reference library having respective addresses which correspond, via the transcoding table, to indices of Q bits which differ only in the p bits having the predetermined positions mentioned.

45. A method for transcoding an input digital data stream ($\Phi'$) representative of a signal (S) coded by means of at least one reference library containing $2^Q$ vectors each designated by an address of Q bits, to form an output digital data stream ($\Phi''$) of a higher rate, in which the input digital data stream contains, for a portion of the signal, at least one index of Q–p bits which, completed by p arbitrary bits of predetermined positions, define indices of Q bits representing a group of $2^p$ addresses of vectors in the reference library, p being an integer such that 0<p<Q, and in which on the basis of the index, already mentioned, of Q–p bits, a translated index of Q bits is determined, representing one of the addresses of the group of $2^p$ addresses of vectors mentioned, and this translated index of Q bits is inserted into the output data stream.

46. A transcoding method according to claim 45, in which the translated index mentioned of Q bits is equal to one of the addresses of the group mentioned of $2^p$ vector addresses.

47. A transcoding method according to claim 46 in which a transcoding table (43) is looked up on the basis of at least one index of Q bits formed by completing the index of Q–p bits contained in the digital data stream ($\Phi'$) by p bits at the predetermined positions mentioned, to obtain at least one of the $2^p$ addresses of the group mentioned.

48. A transcoding method according to any one of claims 45 to 47, comprising a mode of operation in which the Q–p bits of the index contained in the input digital data stream ($\Phi'$) are completed by p bits of predetermined values to determine the translated index of Q bits.

49. A transcoding method according to any one of claims 45 to 48, comprising a mode of operation in which the Q–p bits of the index contained in the input digital data stream ($\Phi'$) are completed by p bits drawn at random to determine the translated index of Q bits.

50. A transcoding method according to any one of claims 45 to 49, comprising a mode of operation in which a coding parameter vector is selected from among the vectors of the reference library having respective addresses which belong to the group of $2^p$ addresses mentioned, on the basis of information on the coded signal, and the translated index of Q bits is formed so that it represents the address of the vector selected.

51. A transcoding method according to claim 50, in which the information on the coded signal mentioned is read from the input digital data stream ($\Phi'$).

52. A transcoding method according to claim 50, in which a prediction is made of the coding parameter vector on the basis of the coding parameter vectors selected for previous portions of the signal, and in which the vector selected shows maximum similarity with the vector predicted from among the vectors of the reference library having respective addresses which belong to the group of $2^p$ addresses mentioned.

53. A transcoder comprising means of signal processing employing a transcoding method according to claim 33 or 45.

* * * * *